United States Patent
Pan et al.

(10) Patent No.: US 9,479,063 B2
(45) Date of Patent: Oct. 25, 2016

(54) FREQUENCY JITTERING CONTROL CIRCUIT AND METHOD FOR A PFM POWER SUPPLY

(75) Inventors: Jiun-Hung Pan, Hsinchu County (TW); Chien-Fu Tang, Hsinchu (TW); Isaac Y. Chen, Hsinchu County (TW)

(73) Assignee: RICHTEK TECHNOLOGY CORP., Chupei, Hsinchu (TW)

( * ) Notice: Subject to any disclaimer, the term of this patent is extended or adjusted under 35 U.S.C. 154(b) by 817 days.

(21) Appl. No.: 13/567,272

(22) Filed: Aug. 6, 2012

(65) Prior Publication Data

US 2013/0051089 A1 Feb. 28, 2013

(30) Foreign Application Priority Data

Aug. 26, 2011 (TW) .............................. 100130691 A

(51) Int. Cl.
*H02M 3/335* (2006.01)
*H02M 1/44* (2007.01)
*H02M 3/156* (2006.01)

(52) U.S. Cl.
CPC ........... *H02M 3/33507* (2013.01); *H02M 1/44* (2013.01); *H02M 3/156* (2013.01); *H02M 3/33515* (2013.01); *H02M 3/33523* (2013.01); *H02M 3/33546* (2013.01); *H02M 2003/1566* (2013.01)

(58) Field of Classification Search
CPC ............. H02M 1/08; H02M 3/33507; H02M 3/33515; H02M 3/33523; H02M 3/33546; H02M 2003/1566
See application file for complete search history.

(56) References Cited

U.S. PATENT DOCUMENTS

| | | | |
|---|---|---|---|
| 4,712,169 A | 12/1987 | Albach | |
| 5,929,620 A | 7/1999 | Dobkin et al. | |
| 6,107,851 A | 8/2000 | Balakirshnan et al. | |
| 6,229,366 B1 | 5/2001 | Balakirshnan et al. | |
| 6,249,876 B1 | 6/2001 | Balakrishnan et al. | |
| 6,728,117 B2 | 4/2004 | Schemmann et al. | |
| 7,289,582 B2 | 10/2007 | Jang et al. | |
| 7,313,005 B2 * | 12/2007 | Azuma | H03K 7/08 318/599 |
| 7,782,036 B1 * | 8/2010 | Wong | H02M 3/156 323/282 |
| 8,897,039 B2 | 11/2014 | Zhu et al. | |
| 2007/0104266 A1 * | 5/2007 | Clara | H03F 3/2173 375/238 |
| 2009/0195191 A1 * | 8/2009 | Lin | H05B 33/0818 315/307 |
| 2009/0196174 A1 | 8/2009 | Ji | |
| 2009/0219000 A1 * | 9/2009 | Yang | H02M 3/33507 323/282 |
| 2010/0073967 A1 * | 3/2010 | Tatsukawa | H02M 3/33507 363/21.18 |
| 2010/0238689 A1 | 9/2010 | Fei et al. | |
| 2010/0246219 A1 | 9/2010 | Ying et al. | |
| 2010/0283440 A1 * | 11/2010 | Futamura | H02M 3/158 323/282 |
| 2011/0110126 A1 | 5/2011 | Morrish | |
| 2011/0291632 A1 * | 12/2011 | Yu et al. | 323/283 |

* cited by examiner

*Primary Examiner* — Matthew Nguyen
*Assistant Examiner* — Lakaisha Jackson
(74) *Attorney, Agent, or Firm* — Muncy, Geissler, Olds & Lowe, P.C.

(57) ABSTRACT

A frequency jittering control circuit for a PFM power supply includes a pulse frequency modulator to generate a frequency jittering control signal to switch a power switch to generate an output voltage. The frequency jittering control circuit jitters an input signal or an on-time or off-time of the pulse frequency modulator to jitter the switching frequency of the power switch to thereby improve EMI issue.

29 Claims, 15 Drawing Sheets

FREQUENCY JITTERING CONTROL CIRCUIT AND METHOD FOR A PFM POWER SUPPLY

FIELD OF THE INVENTION

The present invention is related generally to a switching mode power supply (SMPS) and, more particularly, to pulse frequency modulation (PFM) power supply.

BACKGROUND OF THE INVENTION

Electro-magnetic interference (EMI) is known as a critical issue in designing a switching power supply, and is typically improved by spread-spectrum approaches that improve EMI by jittering the switching frequency of the power supply. Existing pulse width modulation (PWM) power supply devices, as those disclosed in U.S. Pat. Nos. 5,929,620, 6,249,876 and 7,289,582, mainly accomplish spectrum-spreading by jittering the frequency of the oscillator and in turn jittering the switching frequency of the power supply. A PFM power supply is a variable-frequency system whose switching frequency varies with its load, so is less subject to EMI. Such a PFM power supply, however, when having a consistent load, has its switching frequency held consistent, and thus still suffers from EMI. Nevertheless, it is infeasible in the PFM power supply to jitter the switching frequency by jittering the frequency of an oscillator that is absent.

SUMMARY OF THE INVENTION

An objective of the present invention is to provide a frequency jittering control circuit and method for a PFM power supply.

According to the present invention, a frequency jittering control circuit for a PFM power supply comprises a pulse frequency modulator for generating a frequency jittering control signal to switch a power switch and generate an output voltage. In a peak-current mode PFM power supply, the pulse frequency modulator turns on the power switch by triggering the control signal responsive to a first signal, and turns off the power switch by terminating the control signal responsive to a second signal. The frequency jittering control circuit jitters the first or second signal to generate the frequency jittering control signal. In a quasi resonant mode PFM power supply, the pulse frequency modulator jitters the on or off time in order to generate the frequency jittering control signal. In a constant-on-time mode or constant-off-time mode PFM power supply, the pulse frequency modulator jitters the constant on-time or constant off-time in order to generate the frequency jittering control signal.

BRIEF DESCRIPTION OF THE DRAWINGS

These and other objectives, features and advantages of the present invention will become apparent to those skilled in the art upon consideration of the following description of the preferred embodiments according to the present invention taken in conjunction with the accompanying drawings, in which.

DETAILED DESCRIPTION OF THE INVENTION

Figure 1:
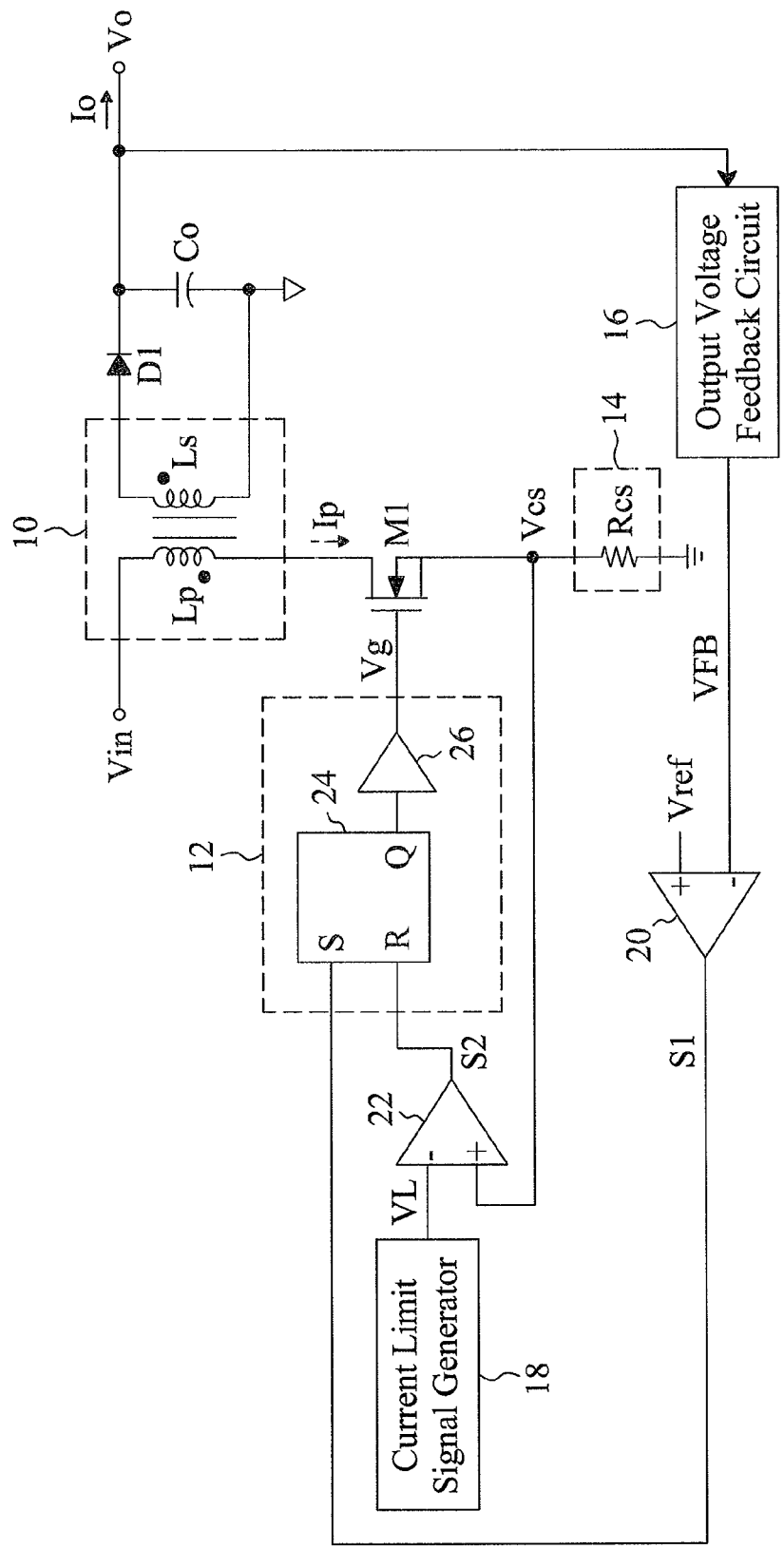
FIG. 1 is a circuit diagram of a first embodiment according to the present invention.
Figure 2:
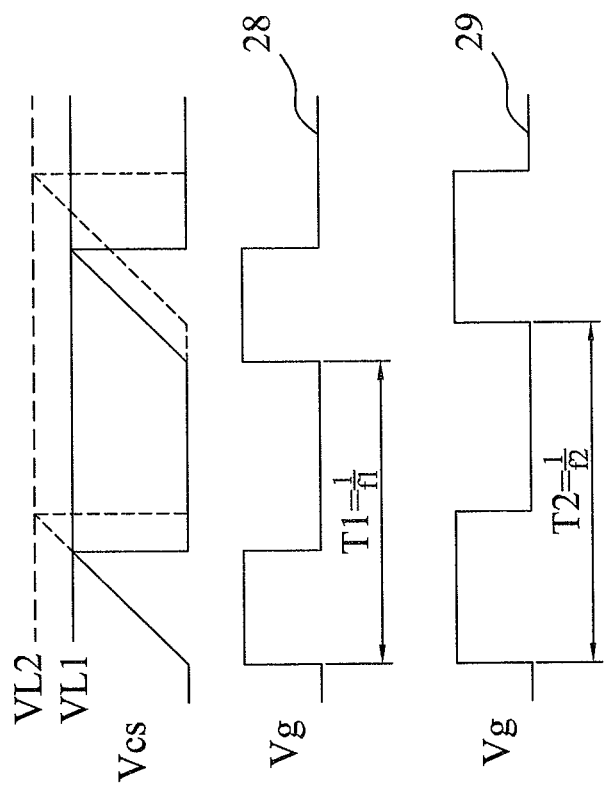
FIG. 2 is a waveform diagram of the control signal for switching the power switch shown in FIG. 1.

A first embodiment according to the present invention shown in FIG. 1 is a peak-current mode PFM power supply that comprises a transformer 10, a power switch M1 connected in series to a primary coil Lp of the transformer 10, and a frequency jittering control circuit that generates a frequency jittering control signal Vg for switching the power switch M1, thereby converting an input voltage Vin into an output voltage Vo. In the frequency jittering control circuit, there are a pulse frequency modulator 12 for generating the control signal Vg according to a first signal S1 and a second signal S2, a current detector 14 for detecting a current Ip of the power switch M1 to generate a current sense signal Vcs, an output voltage feedback circuit 16 for detecting the output voltage Vo to generate a feedback signal VFB, a comparator 20 for comparing the feedback signal VFB with a reference voltage Vref to generate the first signal S1, a current limit signal generator 18 for providing a jittering current limit signal VL, and a comparator 22 for comparing the current limit signal VL with the current sense signal Vcs to generate the second signal S2. In this embodiment, the current detector 14 comprises a current sensing resistor Rcs connected in series to the power switch M1, for generating the current sense signal Vcs when the current Ip passes therethrough. The pulse frequency modulator 12 comprises a flip-flop 24 for generating a pulse frequency modulating signal Q responsive to the signals S1 and S2, and a gate driver 26 for generating the control signal Vg responsive to the pulse frequency modulating signal Q. In the pulse frequency modulator 12, the signals S1 and S2 are input to a setting terminal S and a resetting terminal R of the flip-flop 24, respectively, so the pulse frequency modulating signal Q is to be triggered by the first signal S1 and terminated by the second signal S2, thereby controlling the on time of the power switch M1 to start and end, and in turn controlling the on-time of the power switch M1. More particularly, whenever the output voltage Vo decreases to become lower than the reference voltage Vref, the first signal S1 turns to be logic "1", thereby triggering the pulse frequency modulating signal Q, and in turn turning on the power switch M1 to make the current Ip increase. When the current sense signal Vcs increases to become higher than the current limit signal VL, the second signal S2 turns to be logic "1", thereby resetting the signal Q, and in turn turning off the power switch M1. Since the current limit signal VL jitters, the time for the signal Q to be turned off jitters to jitter the switching frequency of the power switch M1. FIG. 2 illustrates the process clearly. With the rising slope of the current sense signal Vcs remaining unchanged, when the current limit signal VL increases from VL1 to VL2, the current sense signal Vcs needs more time to rise to the current limit signal VL. Thus, the cycle of the control signal Vg increases from T1=1/f1 to T2=1/f2, as shown by waveforms 28 and 29, respectively, meaning that the switching frequency of the power switch M1 decreases from f1 to f2. On the contrary, when the current limit signal VL decreases, the switching frequency of the power switch M1 increases. Therefore, jittering the current limit signal VL is an effective way to jitter the switching frequency of the power switch M1, in turn improving the EMI problem in the PFM power supply.

Figure 3:
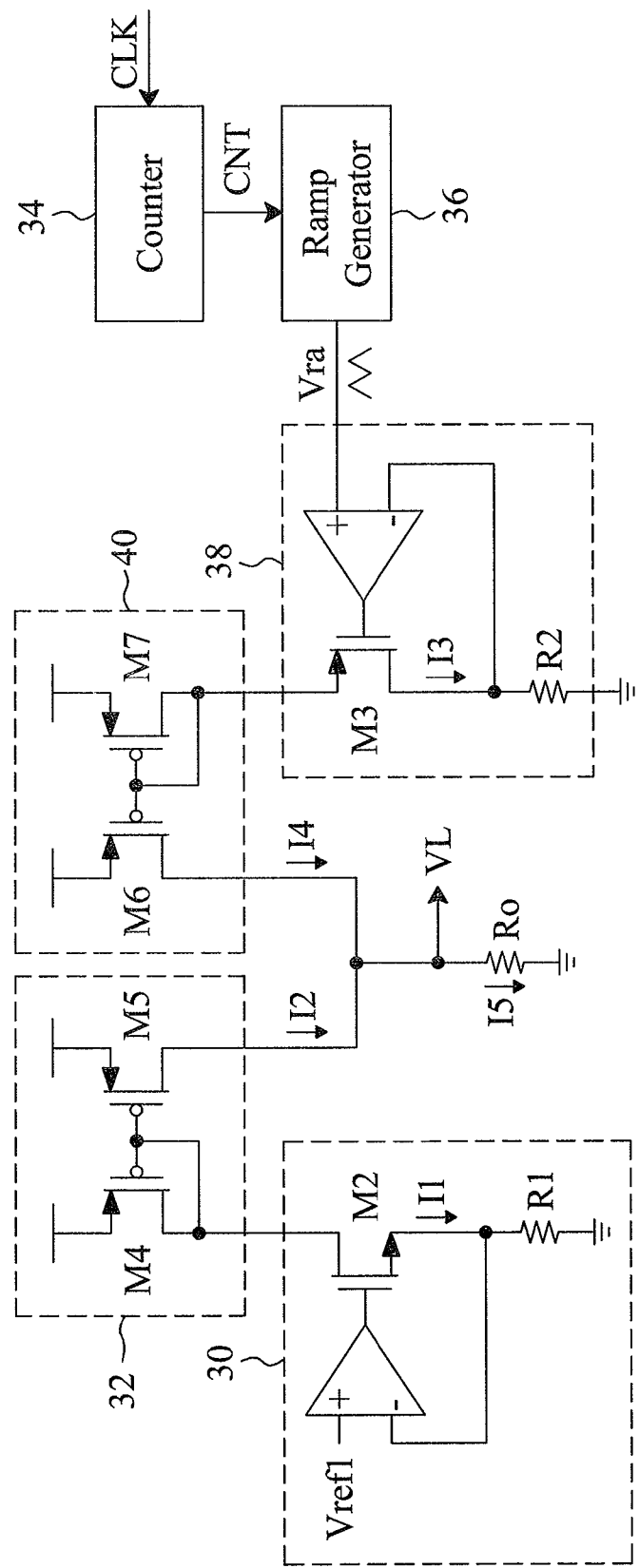
FIG. 3 is a circuit diagram of a first embodiment for the current limit signal generator shown in FIG. 1.

FIG. 3 is a first embodiment of the current limit signal generator 18 of FIG. 1. In the left part, a voltage-to-current converter 30 and a current mirror 32 are for generating the preset current limit signal VL, while a counter 34, a ramp generator 36, a voltage-to-current converter 38 and a current mirror 40 in the right part of FIG. 3 are for jittering the current limit signal VL. The voltage-to-current converter 30 converts the reference voltage Vref1 into a current I1. The current mirror 32 mirrors the current I1 to generate a current I2. The ramp generator 36 provides a ramp signal Vra. The counter 34 generates a count value CNT according to a clock CLK for the ramp generator 36 to adjust the ramp signal Vra. The voltage-to-current converter 38 converts the ramp signal Vra into a current I3. The current mirror 40 mirrors the current I3 to generate a current I4. The currents I2 and I4 are combined into a jittering current I5, which passes through a resistor Ro to generate the jittering current limit signal VL. The clock CLK may be generated by a periodic signal in the PFM power supply, such as the signal Q, Vg or VFB. In other embodiments, the counter 34 may be replaced by a different circuit, such as a random number generator.

Figure 4:
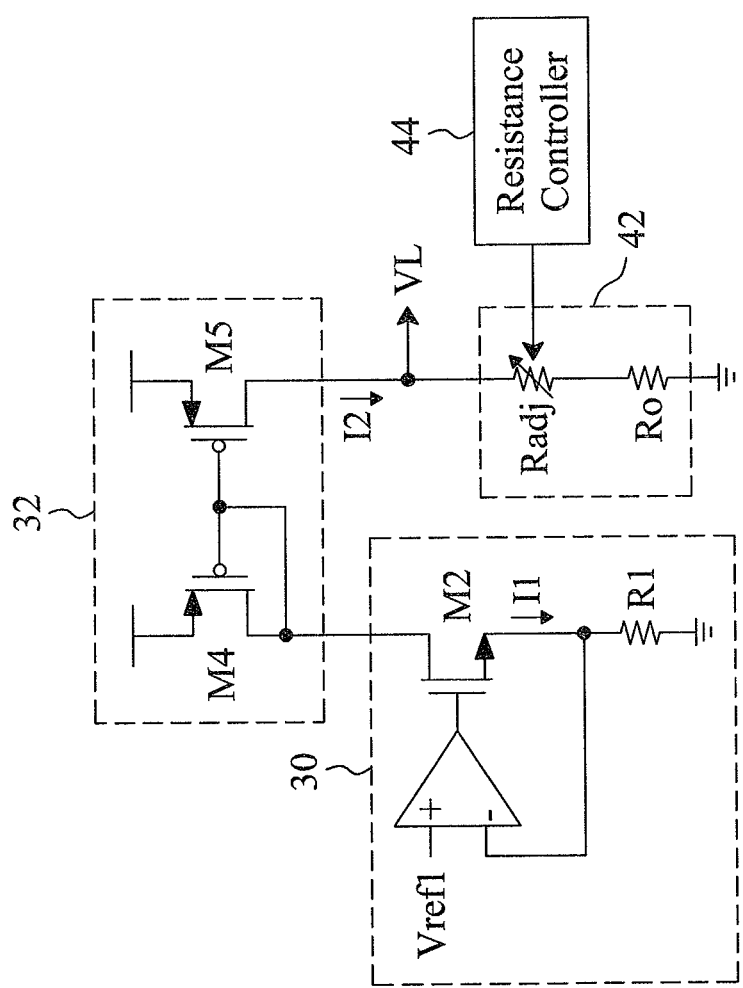
FIG. 4 is a circuit diagram of a second embodiment for the current limit signal generator shown in FIG. 1.

FIG. 4 is a second embodiment of the current limit signal generator 18 of FIG. 1, with the left part identical to that in FIG. 3. The rest of the circuit is composed of a variable resistor 42 and a resistance controller 44. The variable resistor 42 includes a resistor Radj and the resistor Ro connected in series. The resistance controller 44 finely adjusts the resistor Radj to change the resistance of the variable resistor 42, thereby jittering the current limit signal VL. The resistance controller 44 may be realized by a counter or a random number generator.

The embodiment shown in FIG. 1 jitters the switching frequency by jittering the second signal S2, but the other embodiment can jitter the switching frequency by jittering the first signal S1. As the embodiment shown in FIG. 5, the first signal S1 is delayed by a programmable delay circuit 46 for a period of time before it is sent to the pulse frequency modulator 12. A delay time controller 48 adjusts the delay time of the programmable delay circuit 46 according to the output Q of the flip-flop 24, thereby jittering the time where the signal Q is triggered, and in turn, jittering the switching frequency of the power switch M1. The delay time controller 48 may be realized by a counter or a random number generator. In other embodiments, the delay time controller 48 may adjust the delay time of the programmable delay circuit 46 alternatively according to another periodic signal, such as the signal Vg or VFB.

Figure 5:
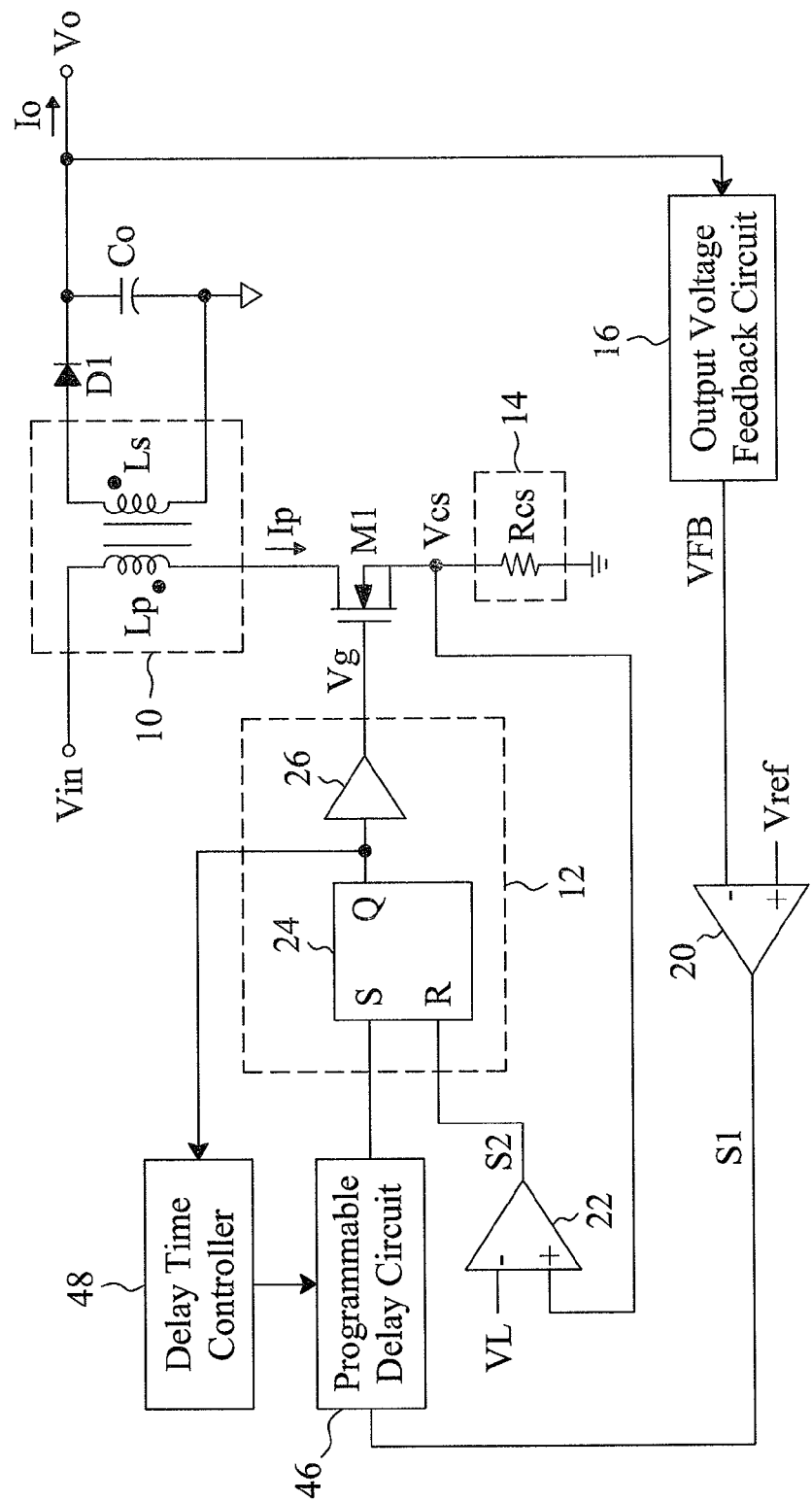
FIG. 5 is a circuit diagram of a second embodiment according to the present invention.
Figure 6:
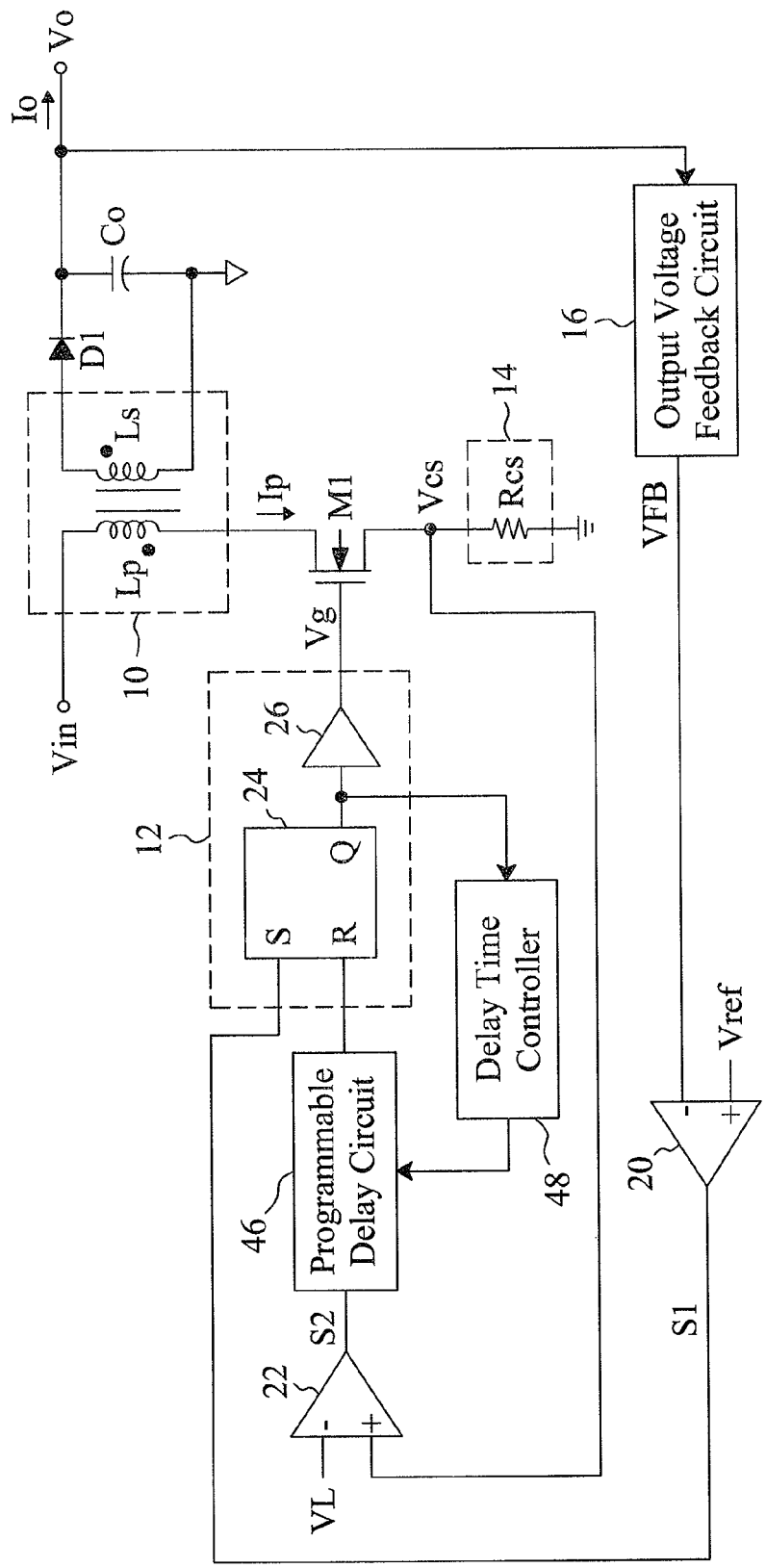
FIG. 6 is a circuit diagram of a third embodiment according to the present invention.

The jitter approach of FIG. 5 may be modified into the embodiment shown in FIG. 6, where the second signal S2 is delayed by the programmable delay circuit 46 for a period of time before sent into the pulse frequency modulator 12, and the delay time controller 48 adjusts the delay time of the programmable delay circuit 46 according to the output Q of the flip-flop 24, thereby jittering the time where the signal Q is reset, and in turn jittering the switching frequency of the power switch M1.

Figure 7:
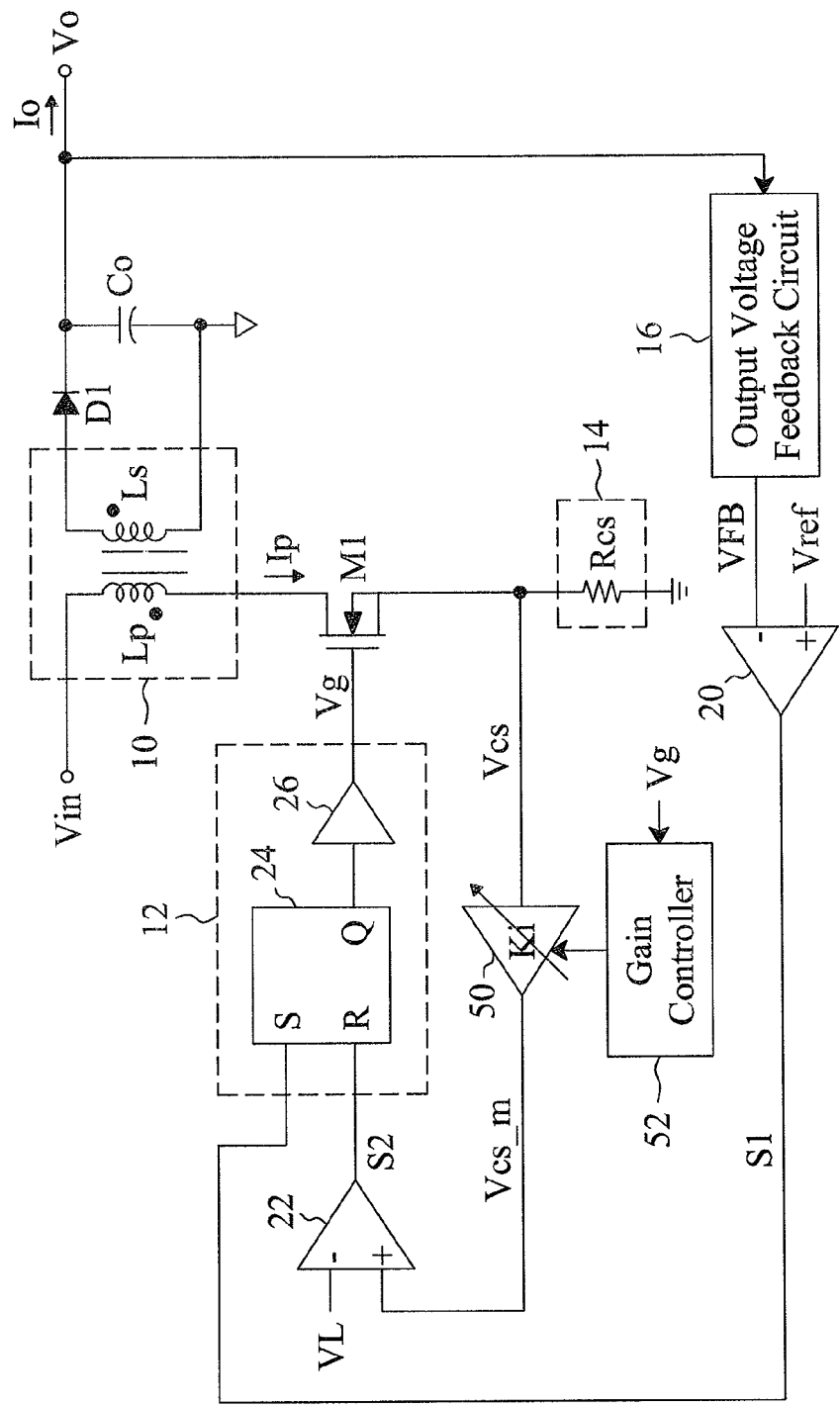
FIG. 7 is a circuit diagram of a fourth embodiment according to the present invention.

While the embodiment of FIG. 1 jitters the second signal S2 by means of jittering the current limit signal VL, it is also feasible to jitter the second signal S2 by jittering the current sense signal Vcs. As the embodiment shown in FIG. 7, the current sense signal Vcs is amplified by a gain circuit 50 into a signal Vcs_m. A gain controller 52 adjusts a gain Ki of the gain circuit 50 according to the control signal Vg, thereby changing the rising slope of the current sense signal Vcs_m, and in turn changing the time where the second signal S2 is triggered, so as to finally change the time where the signal Q is terminated. When the gain Ki of the gain circuit 50 jitters, the switching frequency of the power switch M1 jitters accordingly. In other embodiments, the gain controller 52 may adjust the gain Ki according to another periodic signal. The gain controller 52 may be realized by a counter or a random number generator.

Figure 8:
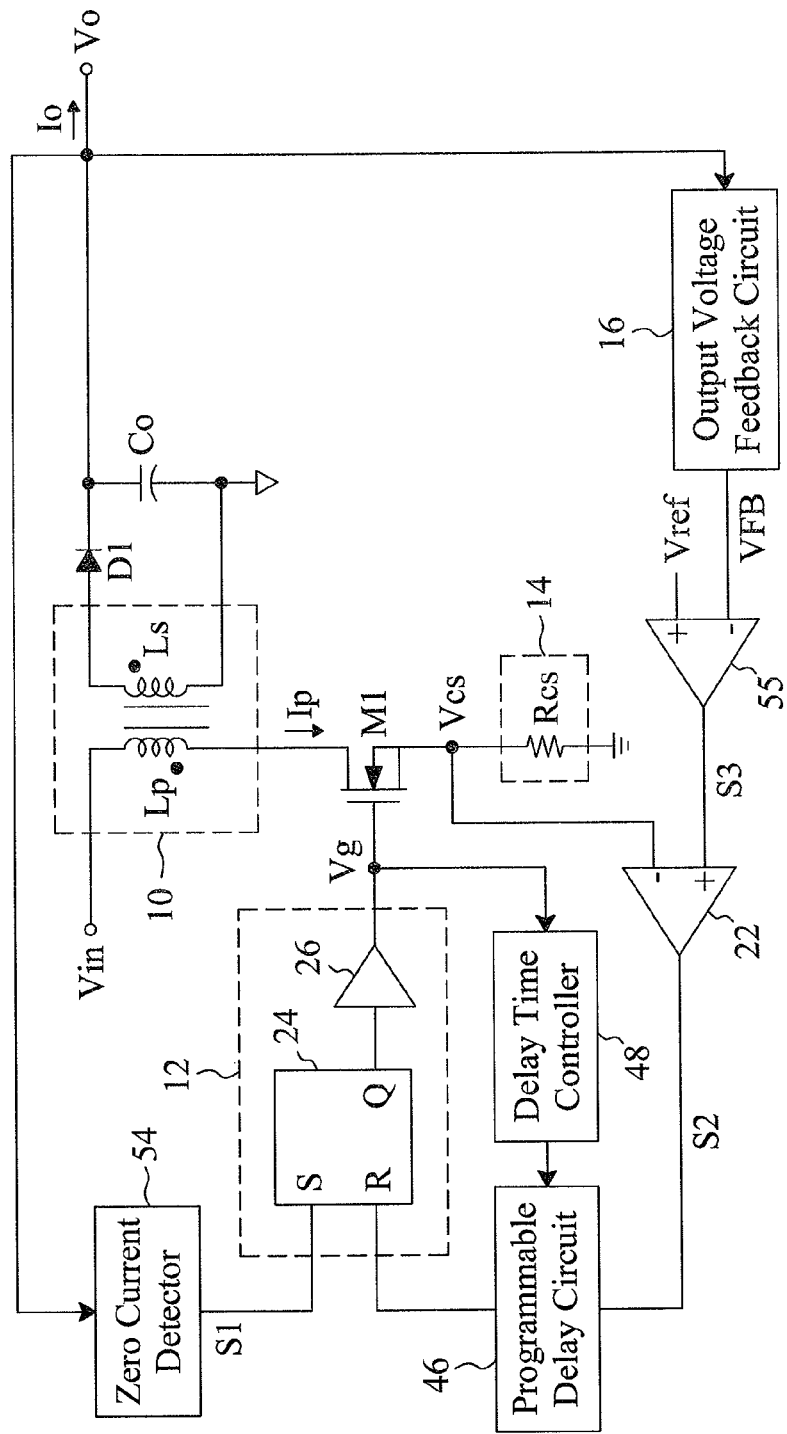
FIG. 8 is a circuit diagram of a fifth embodiment according to the present invention.

FIG. 8 is a quasi resonant (QR) mode PFM power supply, which includes a zero current detector 54 for detecting an output current Io of the PFM power supply and triggering the first signal S1 for the pulse frequency modulator 12 when the output current Io decreases and reaches a threshold value. The current detector 14 detects the current Ip of the power switch M1 to generate the current sense signal Vcs. The output voltage feedback circuit 16 detects the output voltage Vo to generate the feedback signal VFB. An error amplifier 55 amplifies the difference between the feedback signal VFB and the reference voltage Vref to generate a third signal S3. The comparator 22 compares the current sense signal Vcs with the third signal S3 to generate the second signal S2. The pulse frequency modulator 12, similar to the embodiment of FIG. 1, has the signal Q triggered by the first signal S1 and reset by the second signal S2. For jittering the second signal S2, the programmable delay circuit 46 delays the second signal S2 for a period of time before sending it to the pulse frequency modulator 12. The delay time controller 48 adjusts the delay time of the programmable delay circuit 46 according to the control signal Vg. Jittering the delay time of the programmable delay circuit 46 jitters the time where the signal Q is terminated, thereby jittering the switching frequency of the power switch M1.

Figure 9:
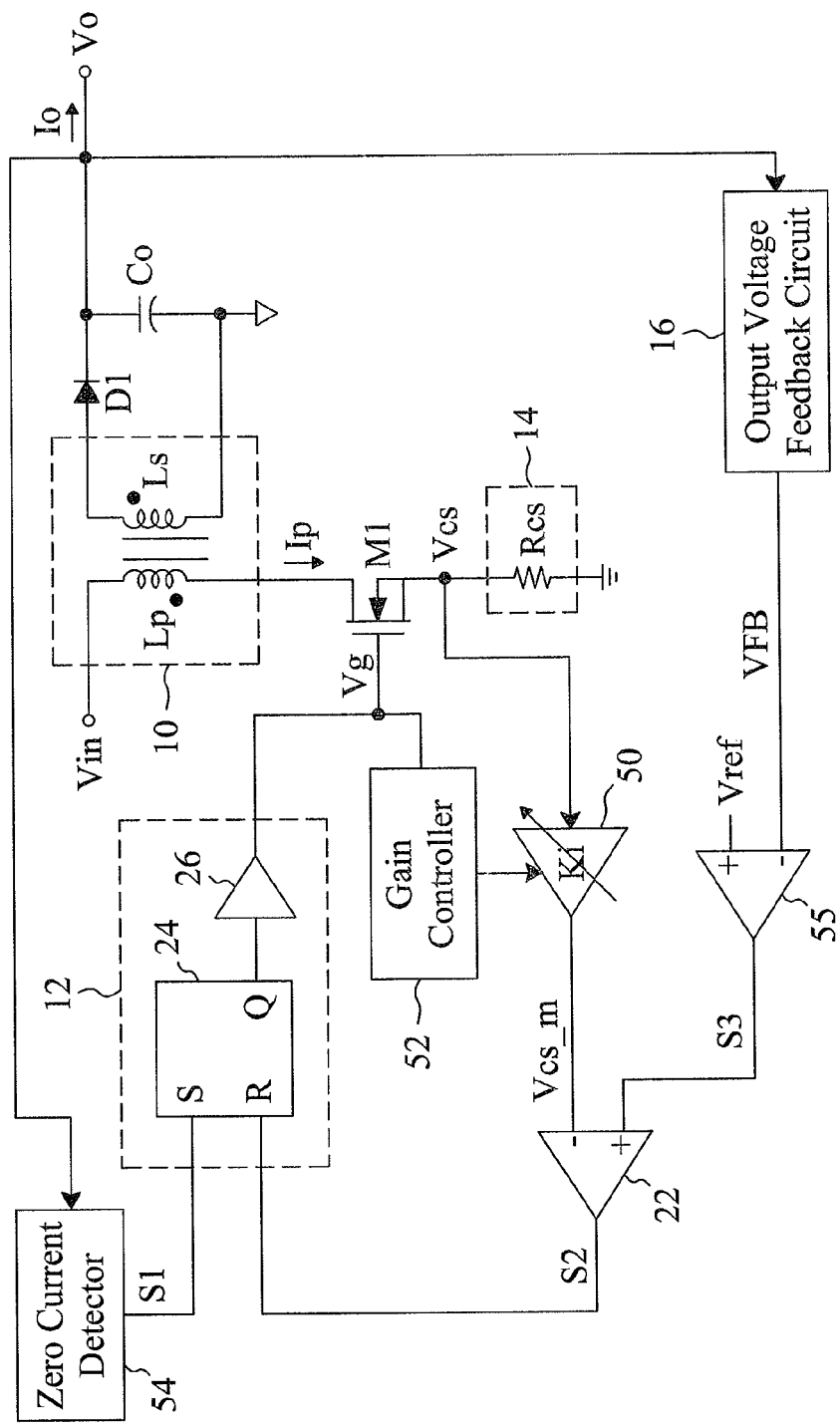
FIG. 9 is a circuit diagram of a sixth embodiment according to the present invention.

The approach to jittering the second signal S2 as shown in FIG. 8 may be modified into the embodiment of FIG. 9, where the gain circuit 50 amplifies the current sense signal Vcs into Vcs_m, and the gain controller 52 jitters the gain Ki of the gain circuit 50 according to the control signal Vg, thereby jittering the rising slope of the current sense signal Vcs_m, then jittering the time where the second signal S2 is triggered, and in turn jittering the time where the signal Q is terminated, so as to finally jitter the switching frequency of the power switch M1.

Figure 10:
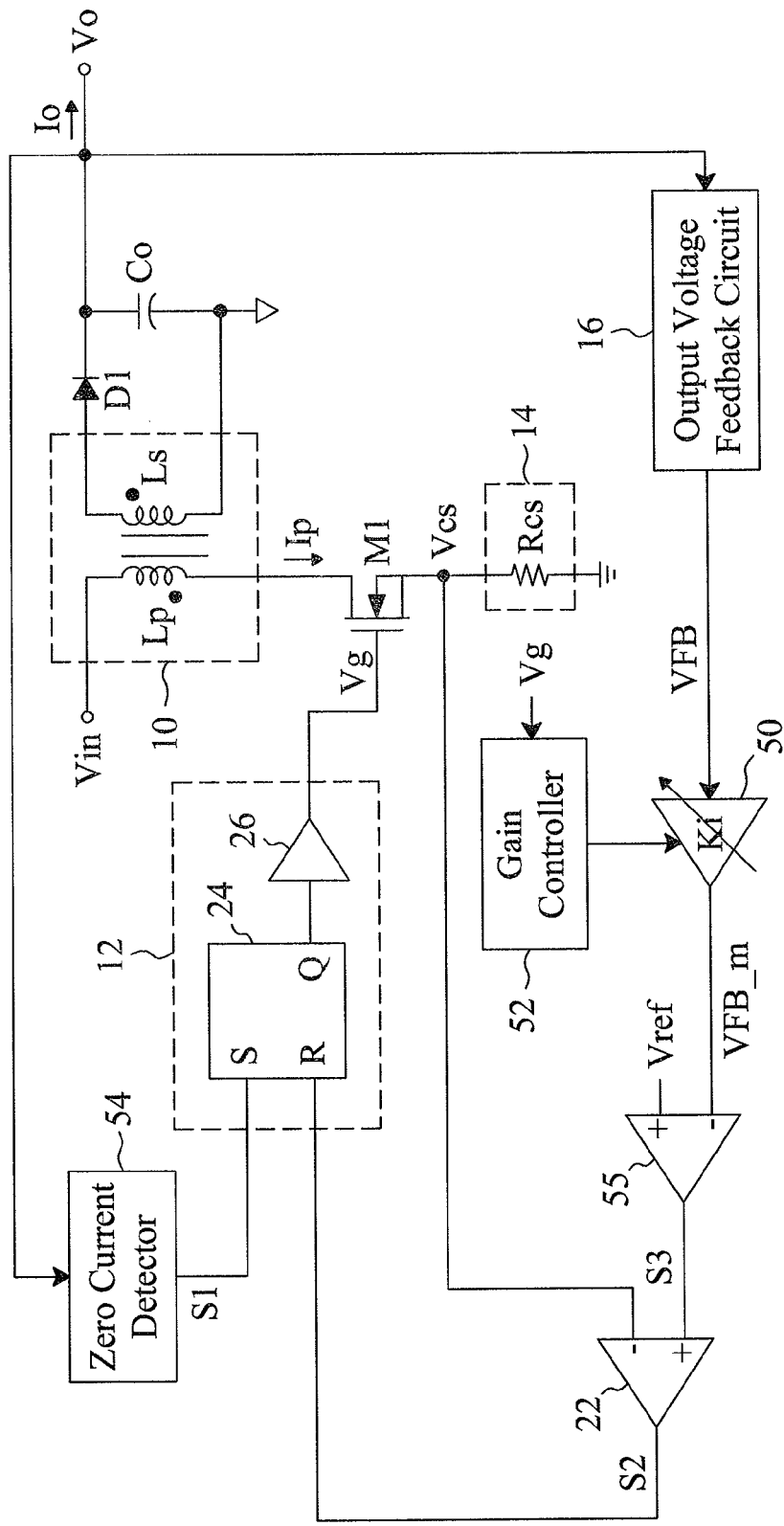
FIG. 10 is a circuit diagram of a seventh embodiment according to the present invention.

The method for jittering the rising slope of the current sense signal Vcs_m as shown in FIG. 9 may be modified into the embodiment of FIG. 10, where the gain circuit 50 amplifies the feedback signal VFB into VFB_m, and the gain controller 52 jitters the gain Ki of the gain circuit 50 according to the control signal Vg, thereby jittering the rising slope of the feedback signal VFB_m, in turn jittering the time where the second signal S2 is triggered, so as to jitter the time when the signal Q is terminated and finally make the switching frequency of the power switch M1 jitter accordingly.

Figure 11:
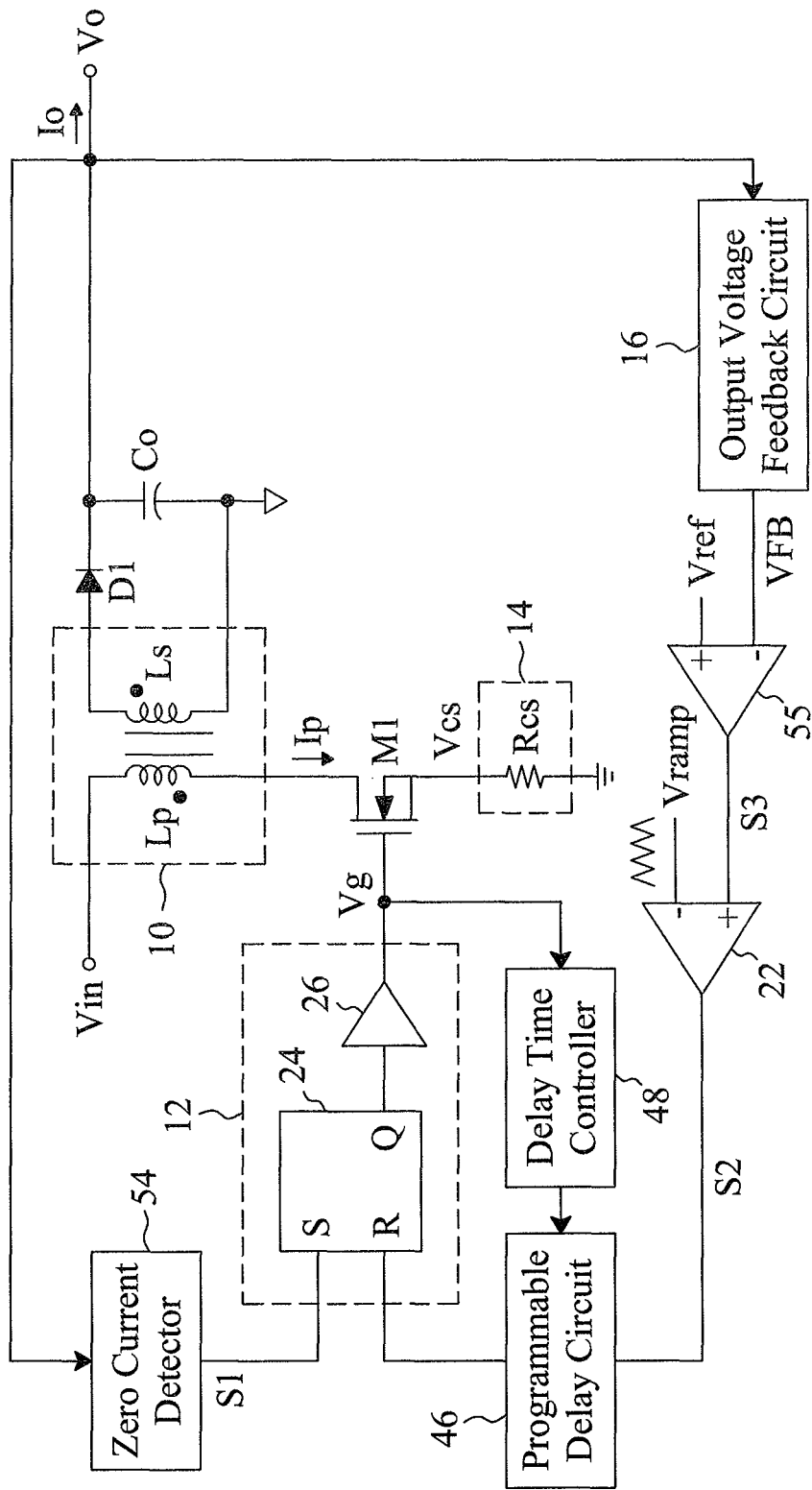
FIG. 11 is a circuit diagram of an eighth embodiment according to the present invention.
Figure 12:
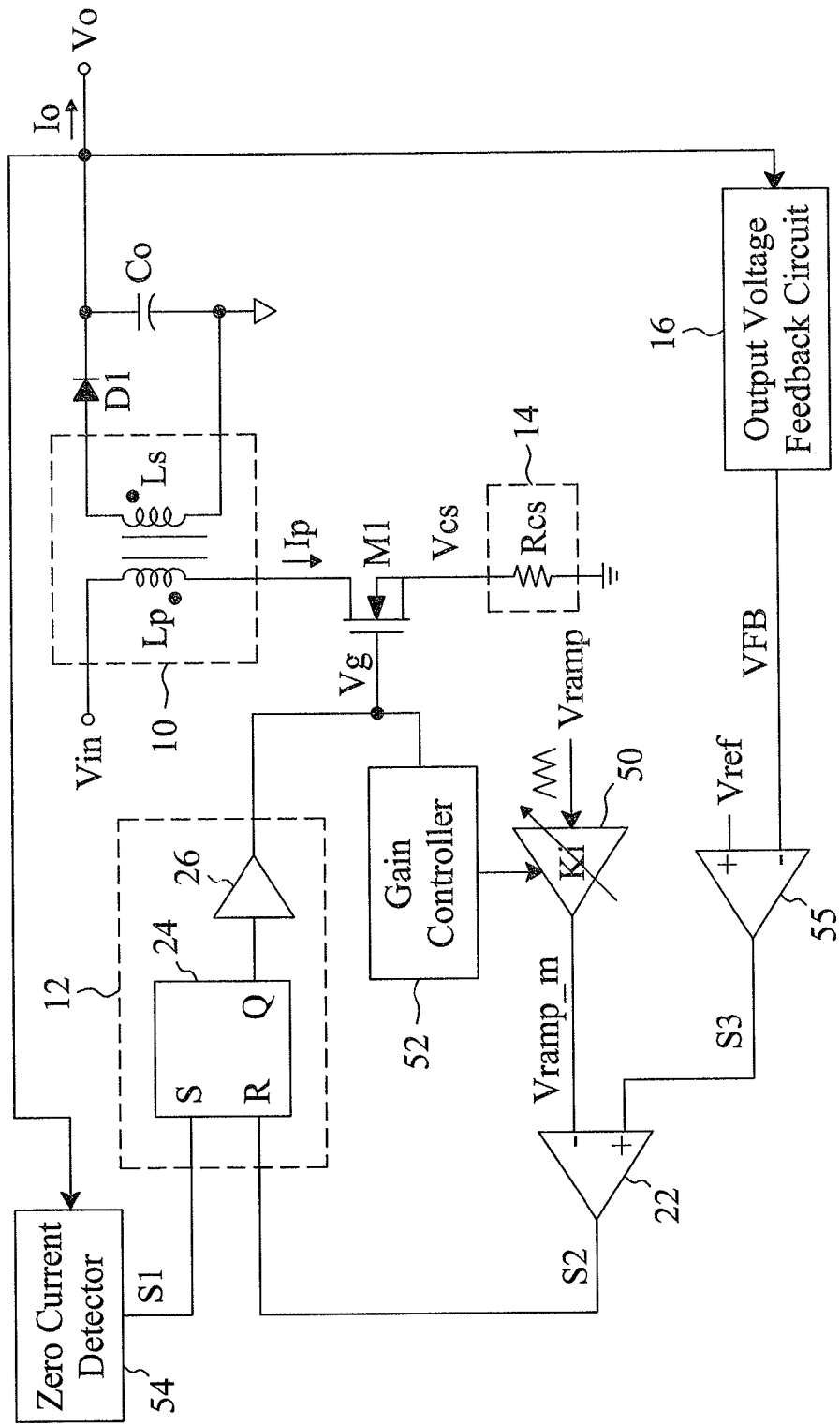
FIG. 12 is a circuit diagram of a ninth embodiment according to the present invention.
Figure 13:
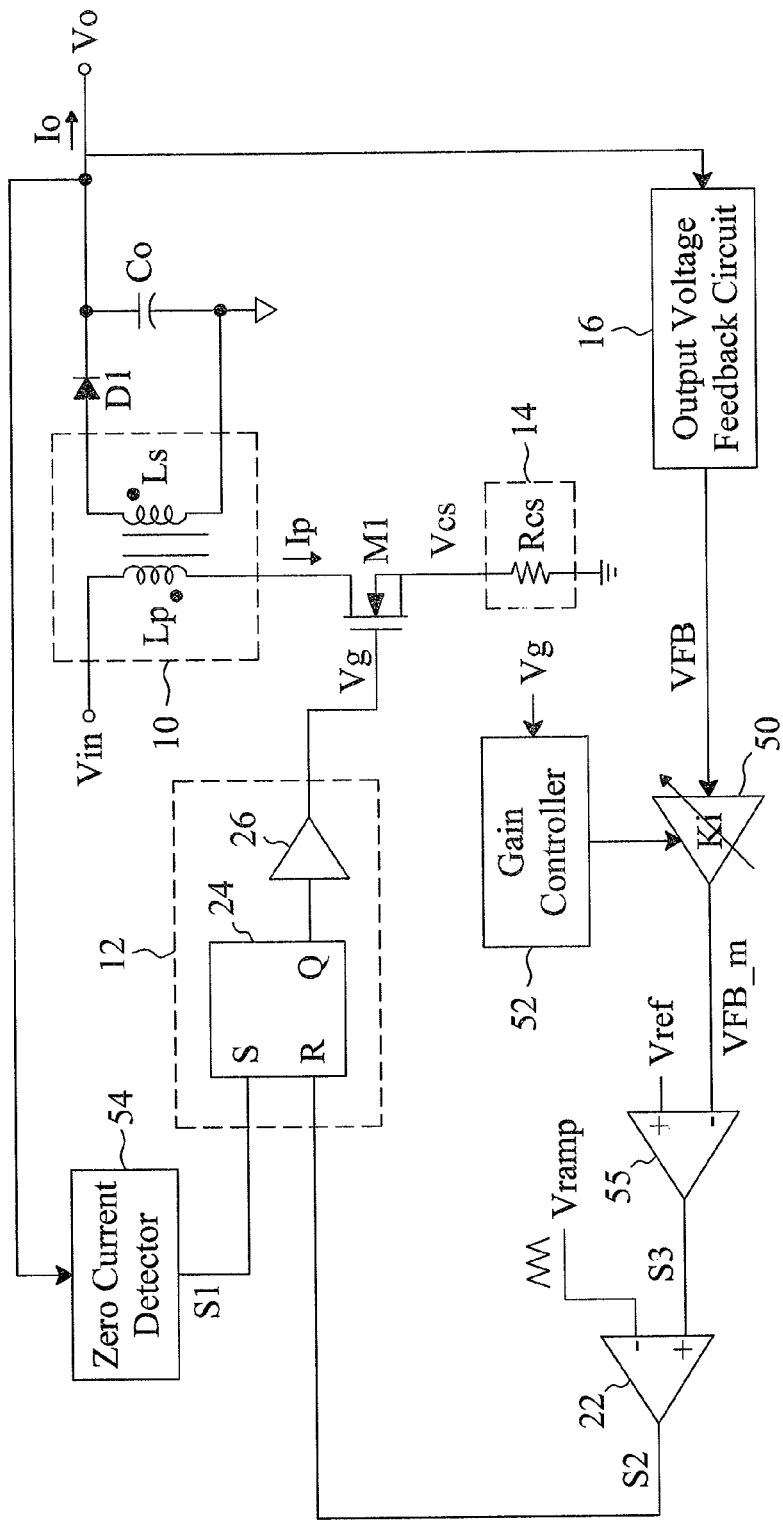
FIG. 13 is a circuit diagram of a tenth embodiment according to the present invention.

The embodiments of FIGS. 8-10 all involve comparing the current sense signal Vcs related to the current Ip of the power switch M1 with the third signal S3 to generate the second signal S2. In other embodiments, another ramp signal may be implemented to replace the current sense signal Vcs. For example, the circuit of FIG. 8 may be modified into a QR voltage mode PFM power supply as shown in FIG. 11. Therein the comparator 22 compares the internal ramp signal Vramp with the third signal S3 to generate the second signal S2. The circuit of FIG. 9 may be modified into a voltage mode structure as shown in FIG. 12. Therein the gain circuit 50 amplifies a ramp signal Vramp to generate a ramp signal Vramp_m, and the comparator 22 compares the ramp signal Vramp_m with the third signal S3 to generate the second signal S2. The circuit of FIG. 10 may be modified into a voltage mode structure as shown in FIG. 13. Therein, the comparator 22 compares the ramp signal Vramp with the third signal S3 to generate the second signal S2.

Figure 14:
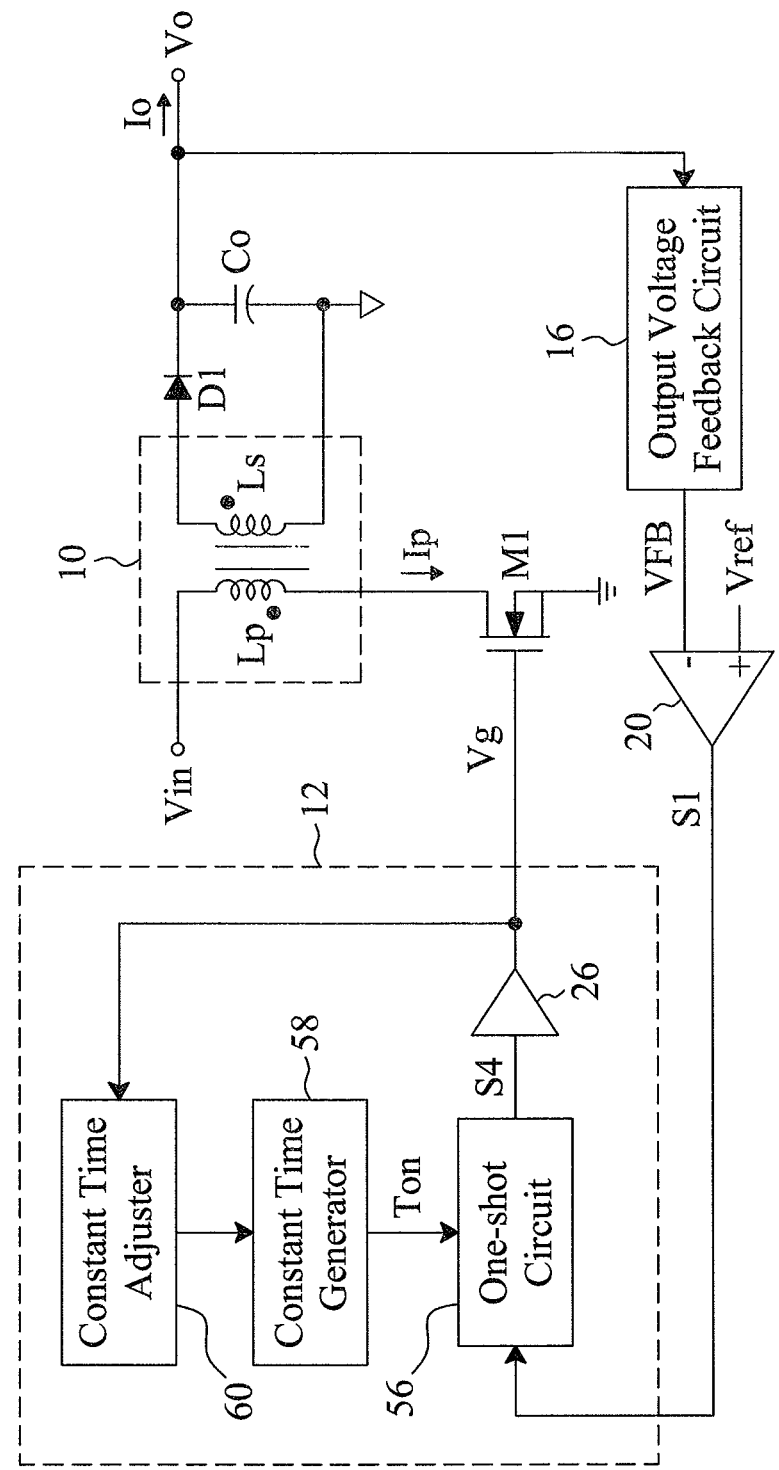
FIG. 14 is a circuit diagram of an eleventh embodiment according to the present invention.

The embodiment shown in FIG. 14 is a constant on-time or constant off-time mode PFM power supply. Its pulse frequency modulator 12 comprises a one-shot circuit 56 triggered by the first signal S1 to generate a pulse signal S4 whose pulse width is determined by the constant time Ton from a constant time generator 58. The constant time Ton is finely adjusted by the constant time adjuster 60 according to the control signal Vg so as to become jittering. The gate driver 26 generates the control signal Vg responsive to the pulse signal S4. By jittering the length of the constant time Ton, the on time or off time of the power switch M1 is jittered, thereby jittering the switching frequency of the power switch M1. In other embodiments, the constant time adjuster 60 may jitter the length of the constant time Ton alternatively according to another periodic signal, such as the feedback signal VFB. The constant time adjuster 60 may be realized by a counter or a random number generator.

Figure 15:
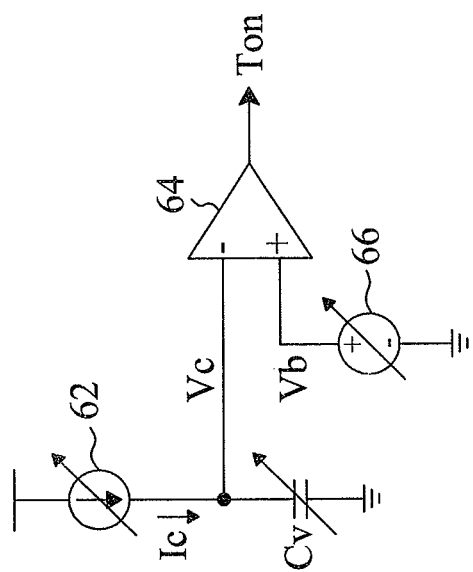
FIG. 15 is a circuit diagram of an embodiment for the constant time generator shown in FIG. 14.

FIG. 15 is one embodiment of the constant time generator 58 of FIG. 14, which includes a current source 62 for providing a charging current Ic that charges a capacitor Cv to generate a charging voltage Vc, a comparator 64 for comparing the charging voltage Vc with a threshold voltage Vb provided by a voltage source 66 to determine the length of the constant time Ton. The constant time adjuster 60 adjusts at least one of the capacitor Cv, the charging current Ic and the threshold voltage Vb, thereby jittering the length of the constant time Ton.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A frequency jittering control circuit for generating a frequency jittering control signal to switch a power switch of a pulse frequency modulation power supply to generate an output voltage, the frequency jittering control circuit comprising:
   a pulse frequency modulator connected to the power switch, for triggering the control signal responsive to a first signal to turn on the power switch, and terminating the control signal responsive to a second signal to turn off the power switch;
   a current limit signal generator for providing a jittering current limit signal;
   a current detector for detecting a current of the power switch to generate a current sense signal; and
   a comparator connected to the pulse frequency modulator, the current limit signal generator and the current detector, for comparing the current sense signal with the current limit signal to generate the second signal;
   wherein the current limit signal generator comprises:
      a first voltage-to-current converter for converting a reference voltage into a first current;
      a first current mirror connected to the first voltage-to-current converter, for mirroring the first current to generate a second current;
      a ramp generator for generating a ramp signal;
      a counter or a random number generator connected to the ramp generator, for adjusting the ramp signal;
      a second voltage-to-current converter connected to the ramp generator, for converting the ramp signal into a third current;
      a second current mirror connected to the second voltage-to-current converter, for mirroring the third current to generate a fourth current; and
      a resistor connected to the first and second current mirrors, for generating the uttering current limit signal according to a sum of the second and fourth currents.

2. A frequency jittering control circuit for generating a frequency jittering control signal to switch a power switch of a pulse frequency modulation power supply to generate an output voltage, the frequency jittering control circuit comprising:
   a pulse frequency modulator connected to the power switch, for triggering the control signal responsive to a first signal to turn on the power switch, and terminating the control signal responsive to a second signal to turn off the power switch;
   a current limit signal generator for providing a jittering current limit signal;
   a current detector for detecting a current of the power switch to generate a current sense signal; and
   a comparator connected to the pulse frequency modulator, the current limit signal generator and the current detector, for comparing the current sense signal with the current limit signal to generate the second signal;
   wherein the current limit signal generator comprises:
      a voltage-to-current converter for converting a reference voltage into a first current;
      a current mirror connected to the voltage-to-current converter, for mirroring the first current to generate a second current;
      a variable resistor connected to the current mirror, for generating the current limit signal according to the second current; and
      a resistance controller connected to the variable resistor, for adjusting a resistance of the variable resistor to jitter the current limit signal, wherein the resistance controller comprises a counter or a random number generator.

3. A frequency jittering control circuit for generating a frequency jittering control signal to switch a power switch of a pulse frequency modulation power supply to generate an output voltage of the pulse frequency modulation power supply, the frequency jittering control circuit comprising:
   a pulse frequency modulator connected to the power switch, for triggering the control signal responsive to a first signal to turn on the power switch, and terminating the control signal responsive to a second signal to turn off the power switch;

an output voltage feedback circuit for detecting the output voltage of the pulse frequency modulation power supply to generate a feedback signal indicating the output voltage of the pulse frequency modulation power supply;

a comparator connected to the output voltage feedback circuit, for comparing the feedback signal indicating the output voltage of the pulse frequency modulation power supply with a reference voltage to generate the first signal;

a programmable delay circuit connected between the comparator and the pulse frequency modulator, for delaying the first signal generated by comparing the feedback signal indicating the output voltage of the pulse frequency modulation power supply with the reference voltage for a delay time and then sending the first signal to the pulse frequency modulator; and a delay time controller connected to the programmable delay circuit, for adjusting the delay time of the programmable delay circuit.

4. The frequency jittering control circuit of claim 3, wherein the delay time controller comprises a counter or a random number generator.

5. A frequency jittering control circuit for generating a frequency jittering control signal to switch a power switch of a pulse frequency modulation power supply to generate an output voltage, the frequency jittering control circuit comprising:

a pulse frequency modulator connected to the power switch, for triggering the control signal responsive to a first signal to turn on the power switch, and terminating the control signal responsive to a second signal to turn off the power switch;

a current detector for detecting a current of the power switch to generate a current sense signal indicating the current of the power switch;

a comparator connected to the current detector, for comparing the current sense signal indicating the current of the power switch with a current limit signal to generate the second signal;

a programmable delay circuit connected between the comparator and the pulse frequency modulator, for delaying the second signal generated by comparing the current sense signal indicating the current of the power switch with the current limit signal for a delay time and then sending the second signal to the pulse frequency modulator; and a delay time controller connected to the programmable delay circuit, for adjusting the delay time of the programmable delay circuit.

6. The frequency jittering control circuit of claim 5, wherein the delay time controller comprises a counter or a random number generator.

7. A frequency jittering control circuit for generating a frequency jittering control signal to switch a power switch of a pulse frequency modulation power supply to generate an output voltage, the frequency jittering control circuit comprising:

a pulse frequency modulator connected to the power switch, for triggering the control signal responsive to a first signal to turn on the power switch, and terminating the control signal responsive to a second signal to turn off the power switch;

a current detector for detecting a current of the power switch to generate a current sense signal;

a gain circuit connected to the current detector, for amplifying the current sense signal;

a comparator connected between the gain circuit and the pulse frequency modulator, for comparing the amplified current sense signal with a current limit signal to generate the second signal; and a gain controller connected to the gain circuit, for adjusting a gain of the gain circuit.

8. The frequency jittering control circuit of claim 7, wherein the gain controller comprises a counter or a random number generator.

9. A frequency jittering control circuit for generating a frequency jittering control signal to switch a power switch of a pulse frequency modulation power supply to generate an output voltage, the frequency jittering control circuit comprising:

a pulse frequency modulator connected to the power switch, for triggering the control signal responsive to a first signal to turn on the power switch, and terminating the control signal responsive to a second signal to turn off the power switch;

a zero current detector connected to an output terminal of the PFM power supply and the pulse frequency modulator, for triggering the first signal when an output current of the PFM power supply decreases to be lower than a threshold value;

an output voltage feedback circuit for detecting the output voltage to generate a feedback signal;

an error amplifier connected to the output voltage feedback circuit, for amplifying a difference between a reference voltage and the feedback signal to generate a third signal;

a current detector for detecting a current of the power switch to generate a current sense signal;

a comparator connected to the error amplifier and the current detector, for comparing the current sense signal with the third signal to generate the second signal;

a programmable delay circuit connected between the comparator and the pulse frequency modulator, for delaying the second signal for a delay time and then sending the second signal to the pulse frequency modulator; and a delay time controller connected to the programmable delay circuit, for adjusting the delay time of the programmable delay circuit.

10. The frequency jittering control circuit of claim 9, wherein the delay time controller comprises a counter or a random number generator.

11. A frequency jittering control circuit for generating a frequency jittering control signal to switch a power switch of a pulse frequency modulation power supply to generate an output voltage, the frequency jittering control circuit comprising:

a pulse frequency modulator connected to the power switch, for triggering the control signal responsive to a first signal to turn on the power switch, and terminating the control signal responsive to a second signal to turn off the power switch;

a zero current detector connected to an output terminal of the PFM power supply and the pulse frequency modulator, for triggering the first signal when an output current of the PFM power supply decreases to be lower than a threshold value;

an output voltage feedback circuit for detecting the output voltage to generate a feedback signal;

an error amplifier connected to the output voltage feedback circuit, for amplifying a difference between a reference voltage and the feedback signal to generate a third signal;

a current detector for detecting a current of the power switch to generate a current sense signal;

a gain circuit connected to the current detector, for amplifying the current sense signal;

a comparator connected to the pulse frequency modulator, the error amplifier and the gain circuit, for comparing the amplified current sense signal with the third signal to generate the second signal; and a gain controller connected to the gain circuit, for adjusting a gain of the gain circuit.

12. The frequency jittering control circuit of claim 11, wherein the gain controller comprises a counter or a random number generator.

13. A frequency jittering control circuit for generating a frequency jittering control signal to switch a power switch of a pulse frequency modulation power supply to generate an output voltage, the frequency jittering control circuit comprising:

a pulse frequency modulator connected to the power switch, for triggering the control signal responsive to a first signal to turn on the power switch, and terminating the control signal responsive to a second signal to turn off the power switch;

a zero current detector connected to an output terminal of the PFM power supply and the pulse frequency modulator, for triggering the first signal when an output current of the PFM power supply decreases to be lower than a threshold value;

an output voltage feedback circuit for detecting the output voltage to generate a feedback signal;

a gain circuit connected to the output voltage feedback circuit, for amplifying the feedback signal;

an error amplifier connected to the gain circuit, for amplifying a difference between a reference voltage and the amplified feedback signal to generate a third signal;

a current detector for detecting a current of the power switch to generate a current sense signal;

a comparator connected to the pulse frequency modulator, the current detector and the error amplifier, for comparing the current sense signal with the third signal to generate the second signal; and a gain controller connected to the gain circuit, for adjusting a gain of the gain circuit.

14. The frequency jittering control circuit of claim 13, wherein the gain controller comprises a counter or a random number generator.

15. A frequency jittering control circuit for generating a frequency jittering control signal to switch a power switch of a pulse frequency modulation power supply to generate an output voltage, the frequency jittering control circuit comprising:

a pulse frequency modulator connected to the power switch, for triggering the control signal responsive to a first signal to turn on the power switch, and terminating the control signal responsive to a second signal to turn off the power switch;

a zero current detector connected to an output terminal of the PFM power supply and the pulse frequency modulator, for triggering the first signal when an output current of the PFM power supply decreases to be lower than a threshold value;

an output voltage feedback circuit for detecting the output voltage to generate a feedback signal;

an error amplifier connected to the output voltage feedback circuit, for amplifying a difference between a reference voltage and the feedback signal to generate a third signal;

a comparator connected to the error amplifier, for comparing a ramp signal with the third signal to generate the second signal;

a programmable delay circuit connected between the comparator and the pulse frequency modulator, for delaying the second signal for a delay time and then sending the second signal to the pulse frequency modulator; and a delay time controller connected to the programmable delay circuit, for adjusting the delay time of the programmable delay circuit.

16. The frequency jittering control circuit of claim 15, wherein the delay time controller comprises a counter or a random number generator.

17. A frequency jittering control circuit for generating a frequency jittering control signal to switch a power switch of a pulse frequency modulation power supply to generate an output voltage, the frequency jittering control circuit comprising:

a pulse frequency modulator connected to the power switch, for triggering the control signal responsive to a first signal to turn on the power switch, and terminating the control signal responsive to a second signal to turn off the power switch;

a zero current detector connected to an output terminal of the PFM power supply and the pulse frequency modulator, for triggering the first signal when an output current of the PFM power supply decreases to be lower than a threshold value;

an output voltage feedback circuit for detecting the output voltage to generate a feedback signal;

an error amplifier connected to the output voltage feedback circuit, for amplifying a difference between a reference voltage and the feedback signal to generate a third signal;

a gain circuit for amplifying a ramp signal;

a comparator connected to the pulse frequency modulator, the error amplifier and the gain circuit, for comparing the amplified ramp signal with the third signal to generate the second signal; and a gain controller connected to the gain circuit, for adjusting a gain of the gain circuit.

18. The frequency jittering control circuit of claim 17, wherein the gain controller comprises a counter or a random number generator.

19. A frequency jittering control circuit for generating a frequency jittering control signal to switch a power switch of a pulse frequency modulation power supply to generate an output voltage, the frequency jittering control circuit comprising:

a pulse frequency modulator connected to the power switch, for triggering the control signal responsive to a first signal to turn on the power switch, and terminating the control signal responsive to a second signal to turn off the power switch;

a zero current detector connected to an output terminal of the PFM power supply and the pulse frequency modulator, for triggering the first signal when an output current of the PFM power supply decreases to be lower than a threshold value;

an output voltage feedback circuit for detecting the output voltage to generate a feedback signal;
a gain circuit connected to the output voltage feedback circuit, for amplifying the feedback signal;
an error amplifier connected to the gain circuit, for amplifying a difference between a reference voltage and the amplified feedback signal to generate a third signal;
a comparator connected to the pulse frequency modulator and the error amplifier, for comparing a ramp signal with the third signal to generate the second signal; and
a gain controller connected to the gain circuit, for adjusting a gain of the gain circuit.

20. The frequency jittering control circuit of claim 19, wherein the gain controller comprises a counter or a random number generator.

21. A frequency jittering control method for generating a frequency jittering control signal to switch a power switch of a pulse frequency modulation power supply to generate an output voltage of the pulse frequency modulation power supply, the frequency jittering control method comprising steps of:
A.) triggering the control signal responsive to a first signal to turn on the power switch;
B.) terminating the control signal responsive to a second signal to turn off the power switch; and
C.) jittering the first or second signal to jitter a switching frequency of the power switch,
wherein the step C comprises steps of:
detecting the output voltage of the pulse frequency modulation power supply to generate a feedback signal indicating the output voltage of the pulse frequency modulation power supply;
comparing the feedback signal indicating the output voltage of the pulse frequency modulation power supply with a reference voltage to generate the first signal;
delaying the first signal generated by comparing the feedback signal indicating the output voltage of the pulse frequency modulation power supply with the reference voltage for a delay time; and
jittering the delay time of the first signal generated by comparing the feedback signal indicating the output voltage of the pulse frequency modulation power supply with the reference voltage.

22. A frequency jittering control method for generating a frequency jittering control signal to switch a power switch of a pulse frequency modulation power supply to generate an output voltage, the frequency jittering control method comprising steps of:
A.) triggering the control signal responsive to a first signal to turn on the power switch;
B.) terminating the control signal responsive to a second signal to turn off the power switch; and
C.) jittering the first or second signal to jitter a switching frequency of the power switch,
wherein the step C comprises steps of:
detecting a current of the power switch to generate a current sense signal indicating the current of the power switch;
comparing the current sense signal indicating the current of the power switch with a current limit signal to generate the second signal;
delaying the second signal generated by comparing the current sense signal indicating the current of the power switch with the current limit signal for a delay time; and
jittering the delay time of the second signal generated by comparing the current sense signal indicating the current of the power switch with the current limit signal.

23. A frequency jittering control method for generating a frequency jittering control signal to switch a power switch of a pulse frequency modulation power supply to generate an output voltage, the frequency jittering control method comprising steps of:
A.) triggering the control signal responsive to a first signal to turn on the power switch;
B.) terminating the control signal responsive to a second signal to turn off the power switch; and
C.) jittering the first or second signal to jitter a switching frequency of the power switch,
wherein the step C comprises steps of:
detecting a current of the power switch to generate a current sense signal;
amplifying the current sense signal according to a gain;
comparing the amplified current sense signal with a current limit signal to generate the second signal; and
jittering the gain.

24. A frequency jittering control method for generating a frequency jittering control signal to switch a power switch of a pulse frequency modulation power supply to generate an output voltage, the frequency jittering control method comprising steps of:
A.) triggering the control signal responsive to a first signal to turn on the power switch;
B.) terminating the control signal responsive to a second signal to turn off the power switch; and
C.) jittering the first or second signal to jitter a switching frequency of the power switch,
wherein the step C comprises steps of:
detecting the output voltage to generate a feedback signal;
amplifying a difference between a reference voltage and the feedback signal to generate a third signal;
detecting a current of the power switch to generate a current sense signal;
comparing the current sense signal with the third signal to generate the second signal;
delaying the second signal for a delay time; and
jittering the delay time of the second signal.

25. A frequency jittering control method for generating a frequency jittering control signal to switch a power switch of a pulse frequency modulation power supply to generate an output voltage, the frequency jittering control method comprising steps of:
A.) triggering the control signal responsive to a first signal to turn on the power switch;
B.) terminating the control signal responsive to a second signal to turn off the power switch; and
C.) jittering the first or second signal to jitter a switching frequency of the power switch,
wherein the step C comprises steps of:
detecting the output voltage to generate a feedback signal;
amplifying a difference between a reference voltage and the feedback signal to generate a third signal;
detecting a current of the power switch to generate a current sense signal;
amplifying the current sense signal according to a gain;
comparing the amplified current sense signal with the third signal to generate the second signal; and
jittering the gain.

26. A frequency jittering control method for generating a frequency jittering control signal to switch a power switch of a pulse frequency modulation power supply to generate an output voltage, the frequency jittering control method comprising steps of:
- A.) triggering the control signal responsive to a first signal to turn on the power switch;
- B.) terminating the control signal responsive to a second signal to turn off the power switch; and
- C.) jittering the first or second signal to jitter a switching frequency of the power switch,
wherein the step C comprises steps of:
- detecting the output voltage to generate a feedback signal;
- amplifying the feedback signal according to a gain;
- amplifying a difference between a reference voltage and the amplified feedback signal to generate a third signal;
- detecting a current of the power switch to generate a current sense signal;
- comparing the third signal with the current sense signal to generate the second signal; and
- jittering the gain.

27. A frequency jittering control method for generating a frequency jittering control signal to switch a power switch of a pulse frequency modulation power supply to generate an output voltage, the frequency jittering control method comprising steps of:
- A.) triggering the control signal responsive to a first signal to turn on the power switch;
- B.) terminating the control signal responsive to a second signal to turn off the power switch; and
- C.) jittering the first or second signal to jitter a switching frequency of the power switch,
wherein the step C comprises steps of:
- detecting the output voltage to generate a feedback signal;
- amplifying a difference between a reference voltage and the feedback signal to generate a third signal;
- comparing a ramp signal with the third signal to generate the second signal;
- delaying the second signal for a delay time; and
- jittering the delay time of the second signal.

28. A frequency jittering control method for generating a frequency jittering control signal to switch a power switch of a pulse frequency modulation power supply to generate an output voltage, the frequency jittering control method comprising steps of:
- A.) triggering the control signal responsive to a first signal to turn on the power switch;
- B.) terminating the control signal responsive to a second signal to turn off the power switch; and
- C.) jittering the first or second signal to jitter a switching frequency of the power switch,
wherein the step C comprises steps of:
- detecting the output voltage to generate a feedback signal;
- amplifying a difference between a reference voltage and the feedback signal to generate a third signal;
- amplifying a ramp signal according to a gain;
- comparing the amplified ramp signal with the third signal to generate the second signal; and
- jittering the gain.

29. A frequency jittering control method for generating a frequency jittering control signal to switch a power switch of a pulse frequency modulation power supply to generate an output voltage, the frequency jittering control method comprising steps of:
- A.) triggering the control signal responsive to a first signal to turn on the power switch;
- B.) terminating the control signal responsive to a second signal to turn off the power switch; and
- C.) jittering the first or second signal to jitter a switching frequency of the power switch,
wherein the step C comprises steps of:
- detecting the output voltage to generate a feedback signal;
- amplifying the feedback signal according to a gain;
- amplifying a difference between a reference voltage and the amplified feedback signal to generate a third signal;
- comparing a ramp signal with the third signal to generate the second signal; and
- jittering the gain.

* * * * *